(12) United States Patent
Chen et al.

(10) Patent No.: US 9,019,721 B2
(45) Date of Patent: Apr. 28, 2015

(54) CONNECTION PORT MODULE AND AN ELECTRONIC DEVICE INCORPORATING THE SAME

(71) Applicant: Wistron Corporation, New Taipei (TW)

(72) Inventors: Yu-Hsun Chen, New Taipei (TW); Chih-Yi Wang, New Taipei (TW); Cheng-Hung Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 163 days.

(21) Appl. No.: 13/749,103

(22) Filed: Jan. 24, 2013

(65) Prior Publication Data

US 2013/0201632 A1    Aug. 8, 2013

(30) Foreign Application Priority Data

Feb. 6, 2012  (TW) .............................. 101103759 A

(51) Int. Cl.
*H05K 7/02* (2006.01)
*H05K 7/14* (2006.01)
*G06F 1/16* (2006.01)

(52) U.S. Cl.
CPC ............ *H05K 7/1427* (2013.01); *G06F 1/1616* (2013.01); *G06F 1/1656* (2013.01)

(58) Field of Classification Search
USPC ........... 361/810; 439/22–24, 52–53, 131, 639
See application file for complete search history.

(56) References Cited

U.S. PATENT DOCUMENTS

| | | | |
|---|---|---|---|
| 6,273,735 B1 * | 8/2001 | Johnson et al. ............... | 439/131 |
| 6,786,743 B2 * | 9/2004 | Huang ........................... | 439/131 |
| 7,066,767 B2 * | 6/2006 | Liao .............................. | 439/639 |
| 7,494,349 B1 * | 2/2009 | Huang et al. .................. | 439/131 |
| 7,540,748 B2 * | 6/2009 | Tracy et al. ................... | 439/131 |
| 7,679,901 B2 * | 3/2010 | Lin .......................... | 361/679.43 |
| 7,811,102 B2 * | 10/2010 | Lai ................................ | 439/131 |
| 2010/0165569 A1 * | 7/2010 | Lai .......................... | 361/679.55 |
| 2010/0317203 A1 * | 12/2010 | Tracy et al. ................... | 439/131 |

FOREIGN PATENT DOCUMENTS

| | | |
|---|---|---|
| TW | 566587 | 12/2003 |
| TW | I273368 | 2/2007 |
| TW | M360388 | 7/2009 |

OTHER PUBLICATIONS

The Office Action issued to Chinese Counterpart Application No. 201210040489.6 by the State Intellectual Property Office of the P.R.C. on Dec. 17, 2014 along with an English translation of sections boxed in red.

* cited by examiner

*Primary Examiner* — Robert J Hoffberg
*Assistant Examiner* — Hung Dang
(74) *Attorney, Agent, or Firm* — Brinks Gilson & Lione

(57) ABSTRACT

A connection port module is mounted to a side wall of a housing of an electronic device. The electronic device includes a control circuit. The connection port module includes a rotating box, a circuit board, and at least one connection port. The rotating box is formed with at least one opening. The circuit board is electrically coupled to the control circuit. The connection port corresponds in number to the opening and is electrically coupled to the circuit board. The connection port is disposed correspondingly to the opening. The rotating box is pivotable relative to the housing between a first position and a second position.

16 Claims, 6 Drawing Sheets

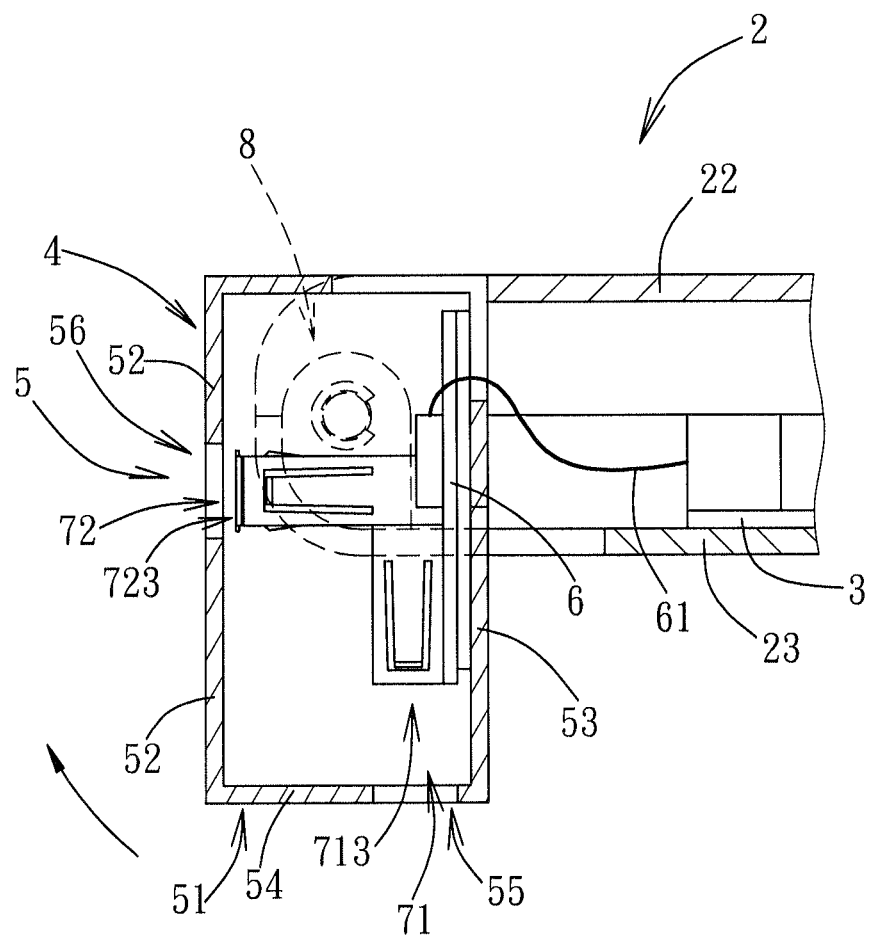
F I G. 5

CONNECTION PORT MODULE AND AN ELECTRONIC DEVICE INCORPORATING THE SAME

CROSS-REFERENCE TO RELATED APPLICATION

This application claims priority to Taiwanese Patent Application No. 101103759, filed on Feb. 6, 2012.

BACKGROUND OF THE INVENTION

1. Field of the Invention

The invention relates to a connection port module and an electronic device having the same, more particularly a connection port module with rotating functionality and an electronic device incorporating the same.

2. Description of the Related Art

Conventional laptop computers are usually provided with connection ports on their periphery for connecting external devices. Common connection ports include universal serial bus (USB) connection ports, Ethernet connection ports, video display interfaces and audio signal ports, etc. Most of the connection ports are disposed fixedly at particular locations of the laptop computers, and lacks flexibility. On another note, these conventional connection ports often adopt an open-type design to facilitate convenient connection by external devices but having the downside of being prone to dust accumulation, which may adversely affecting the formation of electrical connections.

Moreover, for a conventional laptop computer, an air inlet of a heat dissipating module is usually located at the bottom. To solve the problem that heat builds up and heat dissipation effect is unsatisfactory due to poor ventilation, foot pads or a lifting mechanism may be provided underneath the laptop computer to increase ventilation space, or a laptop cooler may be provided to increase heat dissipating efficiency. However, these methods all require the use of additional components.

SUMMARY OF THE INVENTION

Therefore, an object of the present invention is to provide a connection port module with a rotating functionality and having a concealable connection port.

According to one aspect of the present invention, the connection port module is to be mounted to a side wall of a housing of an electronic device. The electronic device includes a control circuit that is disposed in the housing. The connection port module includes a rotating box, a circuit board, and at least one first connection port. The rotating box is formed with at least one first opening and is to be coupled pivotably to the side wall of the housing of the electronic device. The circuit board is disposed in the rotating box and is to be electrically coupled to the control circuit. The at least one first connection port corresponds in number to the at least one first opening and is electrically coupled to the circuit board. Each of the at least one first connection port is disposed in the rotating box at a location corresponding to a corresponding one of the at least one first opening, and is capable of electrically connecting an external device. The rotating box is pivotable relative to the housing between a first position, where access to at least one of the at least one first connection port is permitted so as to enable establishment of electrical connection with the external device, and a second position, where access to at least one of the at least one first connection port is prevented when the electronic device is disposed on a plane.

Preferably, the housing of the electronic device includes a top wall and a bottom wall that are spaced apart from each other, and the rotating box includes a first wall and a second wall that are spaced apart from each other. A distance between the first and second walls of the rotating box is smaller than a distance between the top and bottom walls of the housing such that the first wall is lower than the top wall of the housing and the second wall is higher than the bottom wall of the housing when the rotating box is disposed at the first position.

Preferably, the housing includes a top wall and a bottom wall that are spaced apart from each other, and the rotating box includes a first wall and a second wall that are spaced apart from each other, and a lateral wall connecting the first wall and the second wall. The lateral wall is distal from the side wall of the housing when the rotating box is disposed at the first position. The lateral wall protrudes downwardly from the bottom wall of the housing such that when the electronic device is disposed on a plane, the bottom wall of the housing is spaced apart from the plane.

Preferably, the first opening is formed in the lateral wall of the rotating box.

Preferably, the rotating box is to be eccentrically and pivotably coupled to the housing of the electronic device such that the lateral wall of the rotating box protrudes downwardly from the bottom wall of the housing when the rotating box is disposed at the second position.

Preferably, each of the first and second walls has a width that is greater than a height of the lateral wall such that when the rotating box is disposed at the second position, the lateral wall protrudes downwardly of the bottom wall of the housing.

Preferably, the first opening is formed in the lateral wall of the rotating box. The rotating box is further formed with at least one second opening in the first wall. The connection port module further includes at least one second connection port that corresponds in number to the at least one second opening and that is electrically coupled to the circuit board. Each of the at least one second connection port is disposed in the rotating box at a location that corresponds to a corresponding one of the at least one second opening and is capable of electrically connecting an external device.

Preferably, each of the first and second connection ports includes a hollow body and a conducting terminal disposed in the hollow body and electrically coupled to the circuit board. The hollow body has an insert hole that corresponds in position to the corresponding one of the first and second openings and that permits insert ion of the external device to establish electrical connection with the conducting terminal.

Another object of the present invention is to provide an electronic device incorporating the above-mentioned connection port module.

The electronic device includes the above-mentioned housing, the above-mentioned control circuit, and at least one of the above-mentioned connection port module.

Preferably, the electronic device further includes at least one flexible transmission line that corresponds in number to the connection port module. Each of the at least one flexible transmission line electrically connects the circuit board of a corresponding one of the at least one connection port module to the control circuit. The rotating box of each of the at least one connection port module is further formed with a through hole for extension of the corresponding one of the at least one flexible transmission line therethrough.

Preferably, the electronic device includes two of the connection port modules. The housing includes two of the side walls opposite to each other. The connection port modules are respectively and pivotably coupled to the side walls of the housing.

BRIEF DESCRIPTION OF THE DRAWINGS

Other features and advantages of the present invention will become apparent in the following detailed description of the preferred embodiment with reference to the accompanying drawings, of which:

FIG. 5 is similar to FIG. 4, illustrating the rotating box disposed in a second position.

DETAILED DESCRIPTION OF THE PREFERRED EMBODIMENT

Figure 1:
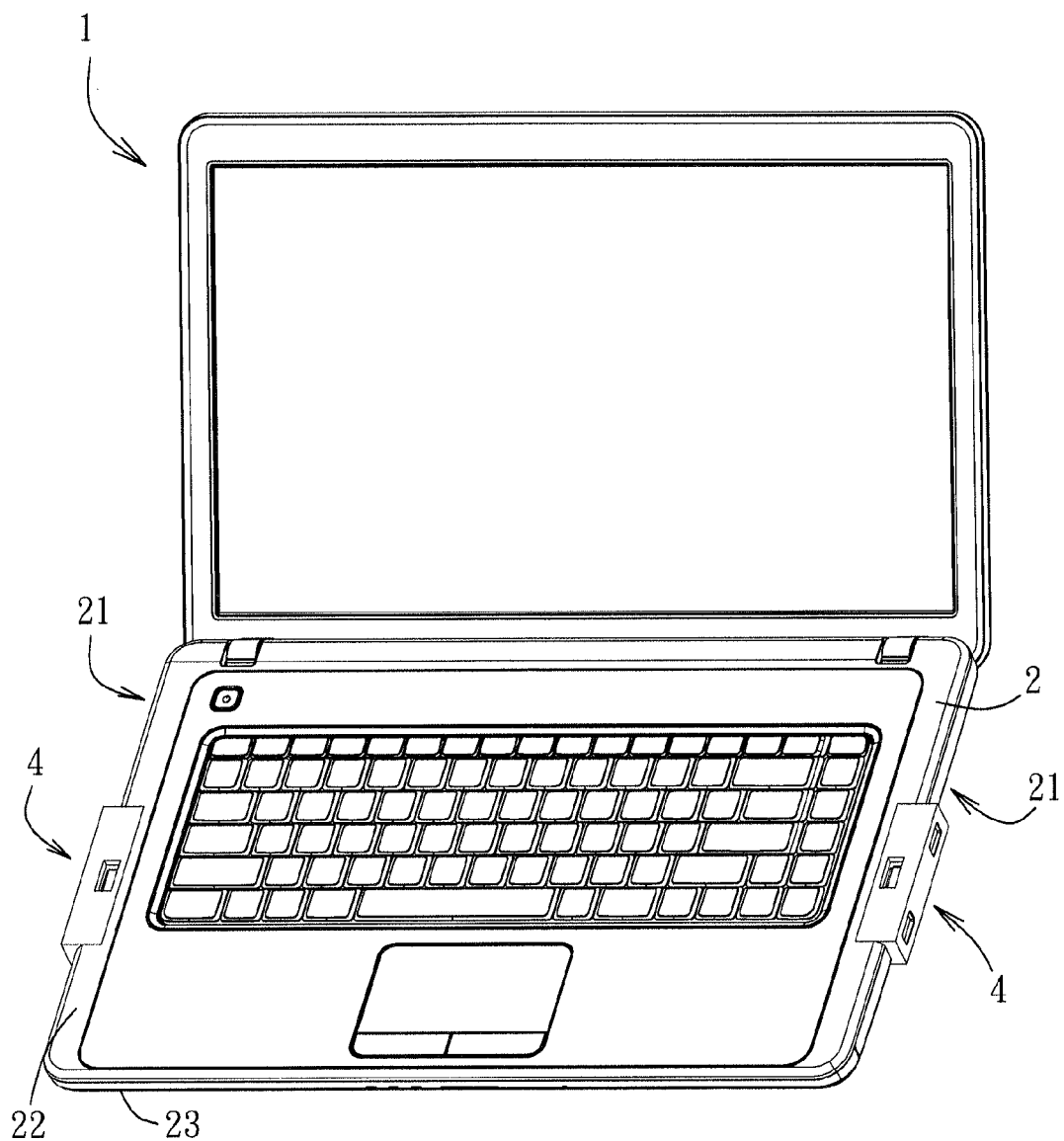
FIG. 1 is a perspective view of an electronic device according to the preferred embodiment of the present invention.
Figure 2:
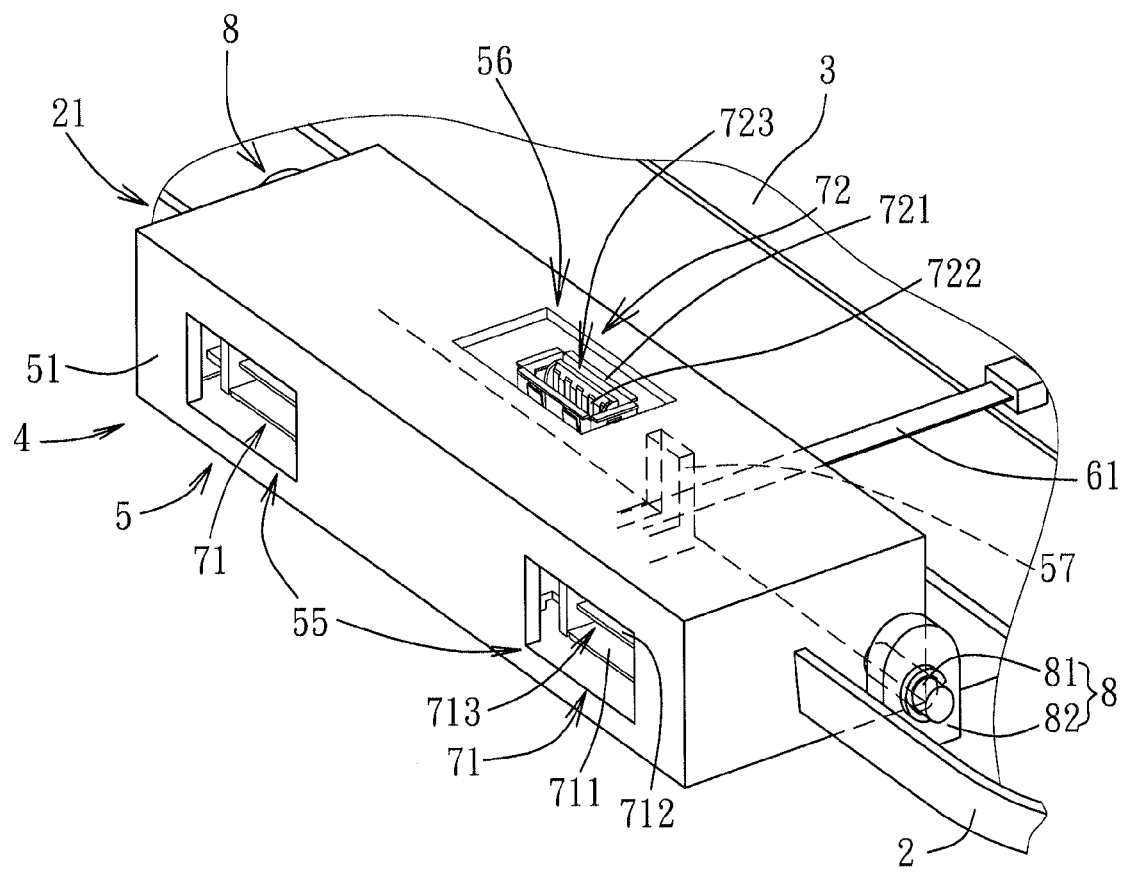
FIG. 2 is a perspective diagram of a connection port module according to the preferred embodiment.
Figure 4:
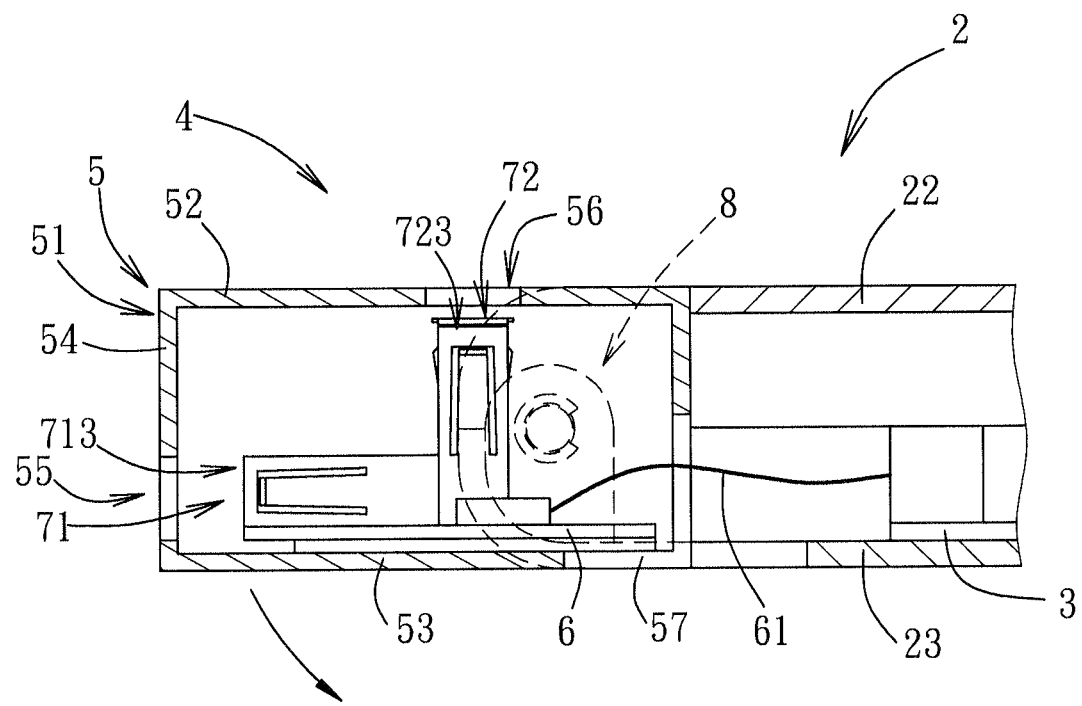
FIG. 4 is a sectional view of the preferred embodiment taken along line IV-IV of FIG. 3, illustrating a rotating box of the connection port module disposed in a first position.

FIGS. 1, 2 and 4 show an electronic device 1 according to the preferred embodiment of the present invention. Preferably, the electronic device 1 according to the preferred embodiment is a laptop computer that permits an external device (not shown) to establish electrical connection therewith. The electronic device 1 includes a housing 2, a control circuit 3 disposed in the housing 2, and two connection port modules 4. The housing 2 includes two side walls 21 disposed opposite to each other. The connection port modules 4 are respectively and pivotably coupled to the side walls 21 of the housing 2, and permits insertion of external devices to establish electrical connections. The housing 2 further includes a top wall 22 and a bottom wall 23 that are spaced apart from each other. Each of the connection port modules 4 includes a rotating box 5, a circuit board 6, two first connection ports 71, a second connection port 72 and a pivot unit 8.

The rotating box 5 includes a hollow casing 51 pivotally coupled to a corresponding one of the side walls 21 of the housing 2 as shown in FIG. 4. The casing 51 is rectangular in shape with the long side parallel to the corresponding side wall 21 of the housing 2. The casing 51 includes a first wall 52 and a second wall 53 that are spaced apart from each other, and a lateral wall 54 connecting the first wall 52 and the second wall 53 and distal from the housing 2. The cross-section of the casing 51 taken perpendicularly to the long side of the casing 51 is rectangular in shape. In the cross-section, edges of the first and second walls 52, 53 are longer than an edge of the lateral wall 54. The casing 51 is formed with two first openings 55 and a second opening 56. The first openings 55 are respectively formed in the lateral wall 54 while the second opening 56 is formed in the first wall 52. The number and the position of the first and second openings 55, 56 are adjustable in other embodiments depending on the situation and are not restricted to the configuration described herein.

The circuit board 6 is disposed in the casing 51 of the rotating box 5 and is electrically coupled to the control circuit 3 via a flexible transmission line 61 that extends through a through hole 57 formed in the casing 51. The first connection ports 71 and the second connection port 72 are respectively disposed in the casing 51 at locations that correspond respectively to the first openings 55 and the second opening 56, and are fixed and electrically coupled to the circuit board 6. Each of the first and second connection ports 71, 72 includes a hollow body 711, 721, and a conducting terminal 712, 722 disposed in the hollow body 711, 721 and electrically coupled to the circuit board 6. The hollow body 711, 721 has an insert hole 713, 723 that corresponds in position to the corresponding one of the first and second openings 55, 56. More specifically, the first and second connection ports 71, 72 are universal serial bus (USB) ports that permit external devices to establish electrical connections with the electronic device 1. However, the first and second connection ports 71, 72 may be other types of connection ports, and are not restricted to the afore-mentioned USB ports of this embodiment.

The pivot unit 8 may have a configuration involving a shaft or a hinge, as generally known in the prior art, and may have a stepless positioning or a multi-step positioning structure to position the rotating box 5 at various angles and positions relative to the housing 2. Preferably, the rotating box 5 is eccentrically and pivotably coupled to the housing 2 by the pivot unit 8. However, the rotating box 5 is not restricted in this aspect, and may also be centrally and pivotably coupled to the housing 2 as long as the rotating box 5 can protrude beyond the bottom wall 23 of the housing 2 at different levels during rotation relative to the housing 2. More specifically, according to this embodiment, the pivot unit 8 includes two pivot elements 81 respectively disposed on two opposite ends of the casing 51 of the rotating box 5, and two pivot seats 82 formed on the housing 2 to correspond to the two pivot elements 81 and each formed with a pivot hole. The rotating box 5 is therefore able to pivot relative to the housing 2 by having the pivot elements 81 inserted into the pivot holes of the pivot seats 82, respectively.

Figure 3:
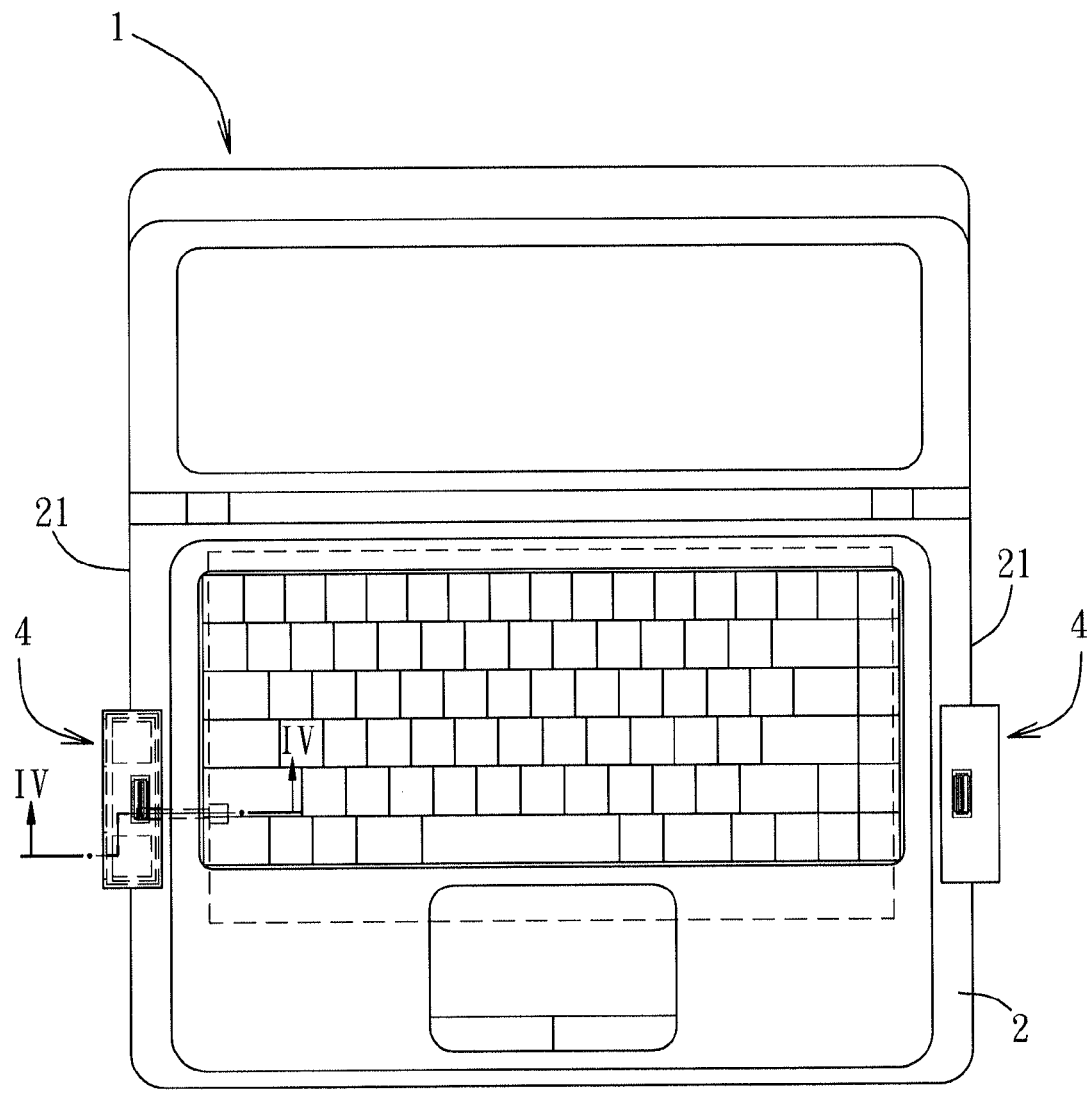
FIG. 3 is a schematic top view of the electronic device.

Referring to FIGS. 3, 4 and 5, in this embodiment, the rotating box 5 is pivotable relative to the housing 2 between a first position (FIG. 4) and a second position (FIG. 5). When the rotating box 5 is at the first position, the first wall 52 of the casing 51 is leveled with the top wall 22 of the housing 2, the second wall 53 of the casing 51 is leveled with the bottom wall 23 of the housing 2, the second opening 56 formed in the first wall 52 faces upwardly, while the two first openings 55 (only one is shown in FIG. 4) formed in the lateral wall 54 of the casing 51 faces outwardly of the side wall 21 of the housing 2. However, at the first position, the first wall 52 of the casing 51 can be lower than the top wall 22 of the housing 2, and the second wall 53 of the casing 51 can be higher than the bottom wall 23 of the housing 2, that is, the configuration is not restricted to this embodiment. When the rotating box 5 is at the second position, the lateral wall 54 which is formed with the two first openings 55 protrudes downwardly from the bottom wall 23 of the housing 2 while the first wall 52 is positioned distal from the housing 2.

Referring to FIGS. 1, 2 and 4, when the rotating box 5 is at the first position, the second opening 56 formed in the first wall 52 and the corresponding second connection port 72 face upward and the first openings 55 formed in the lateral wall 54 and the corresponding first connection ports 71 face outwardly of the side wall 21 of the housing 2, such that the first and second connection ports 71, 72 are available for use.

Figure 6:
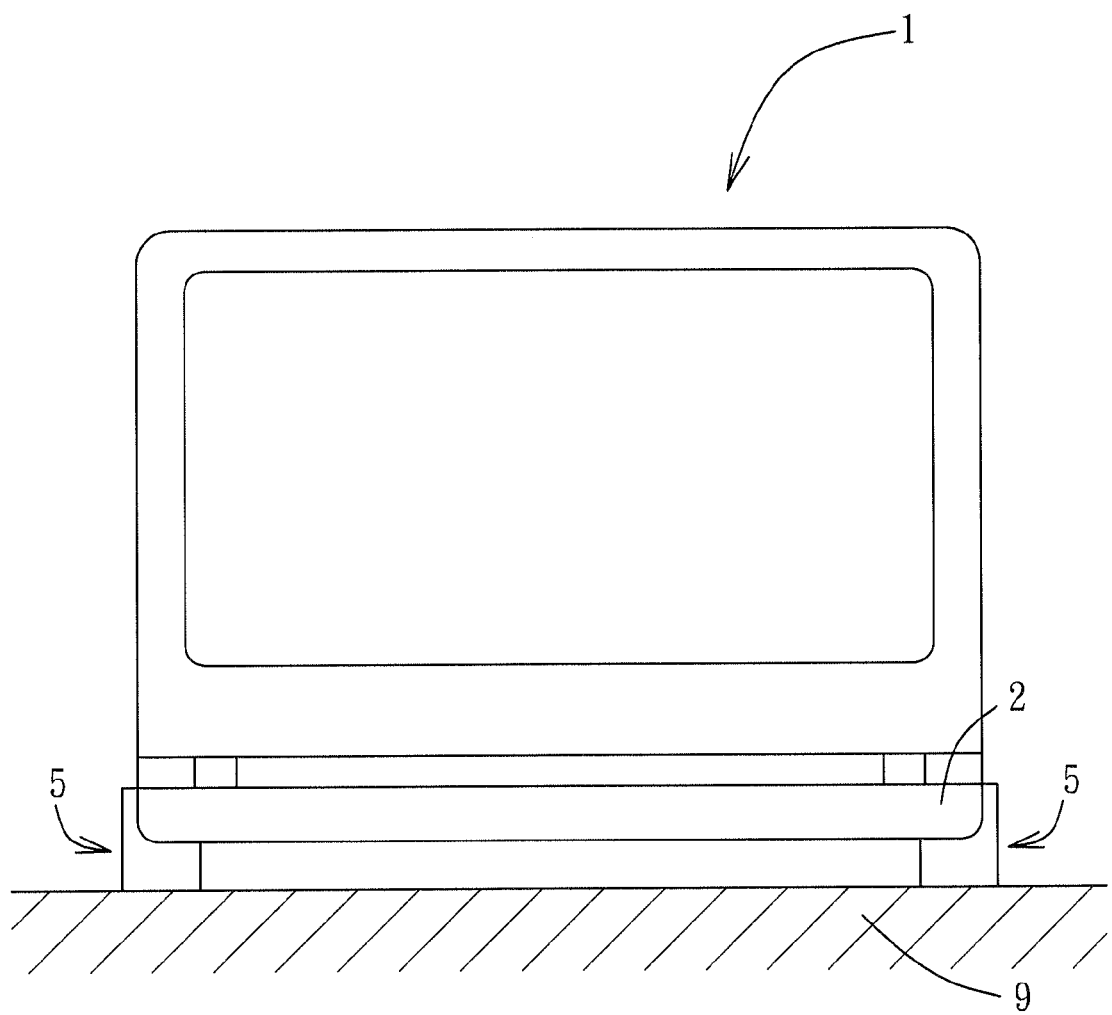
FIG. 6 is a schematic front view of the electronic device illustrating a heat dissipation space when the two connection port modules are at the second position.

Referring to FIGS. 5 and 6, after rotating the rotating box 5 of the connection port module 4 to the second position, the second opening 56 formed in the first wall 52 and the corresponding second connection port 72 is rotated to face outwardly of the side wall 21 of the housing 2, and the first openings 55 formed in the lateral wall 54 and the corresponding first connection ports 71 are rotated to face downward and, when the electronic device 1 is disposed on a plane 9 (e.g., tabletop), are covered to be dustproof. At this time, the uncovered second connection port 72 can be used to establish electrical connection with an external device. Moreover, when the rotating boxes 5 of both of the connection port modules 4 are at the second position, the lateral walls 54 of the rotating boxes 5 protrude downwardly from the bottom wall 23 of the housing 2, and with the cooperation of the two rotating boxes 5 in the second position, when the electronic device 1 is disposed on the plane 9, the bottom wall 23 of the housing 2 is spaced apart from the plane 9 to form a heat dissipating space so as to promote heat dissipation efficiency of the electronic device 1. Even when the user places the electronic device 1 on materials that do not dissipate heat very well (e.g., on a bed), since the electronic device 1 is elevated due to the protruding the rotating boxes 5 of both of the connection port modules 4, the electronic device 1 would not easily overheat.

In this embodiment, when the rotating box 5 is at the first position, each of the first and second openings 55, 56 in the lateral wall 54 and the first wall 52 is provided with a corresponding first or second connection port 71, 72. However, the configuration can also be such that only the first openings 55 formed in the lateral wall 54 is provided therein with the first connection port 71 such that when the rotating box 5 is rotated to the second position, all of the first connection ports 71 are covered to achieve the dustproof effect. However, with such configuration, the connection ports 71 cannot be used to establish electrical connection with external devices.

On the other hand, although in this embodiment, the connection port modules 4 are respectively disposed on the left and right side walls 21 of the housing 2, the actual application is not restricted to the afore-mentioned configuration. The connection port module 4 may also be disposed at the rear of the housing 2. The number of the connection port modules 4 can be one disposed in the middle of a posterior wall of the housing 2, or two symmetrically disposed at the posterior wall. It may also be such that one connection port module 4 is disposed at an anterior wall of the housing 2 and another connection port module 4 is disposed at the posterior wall of the housing 2.

From the above, the connection port module 4 is mounted pivotably to the housing 2, and provides external devices with different connecting options. When the rotating box 5 of the connection port module 4 is in the first position, users can use the first and second connection ports 71, 72 for connection with external devices. When the rotating box 5 of the connection port module 4 is at the second position, the first connection ports 71 in the lateral wall 54 are covered to prevent external substances from entering, while the second connection port 72 is still available for use, and simultaneously, the rotation box 5 further helps elevating the electronic device 1 to promote heat dissipation.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A connection port module to be mounted to a side wall of a housing of an electronic device, the electronic device including a control circuit that is disposed in the housing, said connection port module comprising:
   a rotating box formed with at least one first opening and to be coupled pivotally to the side wall of the housing of the electronic device;
   a circuit board disposed in said rotating box and to be electrically coupled to the control circuit; and
   at least one first connection port corresponding in number to said at least one first opening, and electrically coupled to said circuit board, each of said at least one first connection port being disposed in said rotating box at a location corresponding to a corresponding one of said at least one first opening to be electrically connected to an external device;
   wherein said rotating box is pivotable relative to the housing between a first position, where access to at least one of said at least one first connection port is permitted so as to enable establishment of electrical connection with the external device, and a second position, where access to at least one of said at least one first connection port is prevented when the electronic device is disposed on a plane,
   the housing including a top wall and a bottom wall that are spaced apart from each other, wherein said rotating box includes a first wall and a second wall that are spaced apart from each other, and a lateral wall connecting said first wall and said second wall, said lateral wall being distal from the side wall of the housing when said rotating box is disposed at the first position, said lateral wall protruding downwardly from the bottom wall of the housing such that when the electronic device is disposed on a plane, the bottom wall of the housing is spaced apart from the plane.

2. The connection port module as claimed in claim 1, wherein a distance between said first and second walls of said rotating box is smaller than a distance between the top and bottom walls of the housing such that said first wall is lower than the top wall of the housing and said second wall is higher than the bottom wall of the housing when said rotating box is disposed at the first position.

3. The connection port module as claimed in claim 1, wherein said first opening is formed in said lateral wall of said rotating box.

4. The connection port module as claimed in claim 1, wherein said rotating box is to be eccentrically and pivotably coupled to the housing of the electronic device such that said lateral wall of said rotating box protrudes downwardly from the bottom wall of the housing when said rotating box is disposed at the second position.

5. The connection port module as claimed in claim 1, wherein each of said first and second walls has a width that is greater than a height of said lateral wall such that when said rotating box is disposed at the second position, said lateral wall protrudes downwardly of the bottom wall of the housing.

6. The connection port module as claimed in claim 1, wherein said first opening is formed in said lateral wall of said rotating box, and said rotating box is further formed with at least one second opening in said first wall, said connection port module further comprising at least one second connection port that corresponds in number to said at least one second opening and that is electrically coupled to said circuit board, each of said at least one second connection port being disposed in said rotating box at a location that corresponds to a corresponding one of said at least one second opening to be electrically connected to an external device.

7. The connection port module as claimed in claim 6, wherein each of said first and second connection ports includes a hollow body and a conducting terminal disposed in said hollow body and electrically coupled to said circuit board, said hollow body having an insert hole that corresponds in position to the corresponding one of said first and second openings and that permits insertion of the external device to establish electrical connection with the conducting terminal.

8. An electronic device comprising:
   a housing including a side wall;

a control circuit disposed in said housing; and
at least one connection port module including
    a rotating box formed with at least one first opening and coupled pivotably to said side wall of said housing,
    a circuit board disposed in said rotating box and electrically coupled to said control circuit, and
    at least one first connection port corresponding in number to said at least one first opening, and electrically coupled to said circuit board, each of said at least one first connection port being disposed in said rotating box at a location corresponding to a corresponding one of said at least one first opening, to be electrically connected to an external device;
wherein said rotating box is pivotable relative to said housing between a first position, where access to at least one of said at least one first connection port is permitted so as to enable establishment of electrical connection with the external device, and a second position, where access to at least one of said at least one first connection port is prevented when the electronic device is disposed on a plane; and
wherein said housing includes a top wall and a bottom wall that are spaced apart from each other, said rotating box including a first wall and a second wall that are spaced apart from each other, and a lateral wall connecting said first wall and said second wall, said lateral wall being distal from said side wall of said housing when said rotating box is disposed at the first position, said lateral wall protruding downwardly from said bottom wall of said housing such that when the electronic device is disposed on a plane, said bottom wall of said housing is spaced apart from the plane.

9. The electronic device as claimed in claim 8, wherein a distance between said first and second walls of said rotating box is smaller than a distance between said top and bottom walls of said housing such that said first wall is lower than said top wall of said housing and said second wall is higher than said bottom wall of said housing when said rotating box is disposed at the first position.

10. The electronic device as claimed in claim 8, wherein said first opening is formed in said lateral wall of said rotating box.

11. The electronic device as claimed in claim 8, wherein said rotating box is eccentrically and pivotably coupled to said housing such that said lateral wall of said rotating box protrudes downwardly from said bottom wall of said housing when said rotating box is disposed at the second position.

12. The electronic device as claimed in claim 8, wherein each of said first and said second walls has a width that is greater than a height of said lateral wall such that when said rotating box is disposed at the second position, said lateral wall protrudes downwardly of said bottom wall of said housing.

13. The electronic device as claimed in claim 8, wherein said first opening is formed in said lateral wall of said rotating box, and said rotating box is further formed with at least one second opening in said first wall, said connection port module further including at least one second connection port that corresponds in number to said at least one second opening and that is electrically coupled to said circuit board, each of said at least one second connection port being disposed in said rotating box at a location that corresponds to a corresponding one of said at least one second opening and being to be electrically connected to an external device.

14. The electronic device as claimed in claim 13, wherein each of said first and second connection ports includes a hollow body and a conducting terminal disposed in said hollow body and electrically coupled to said circuit board, said hollow body having an insert hole that corresponds in position to the corresponding one of said first and second openings and that permits insertion of the external device to establish electrical connection with the conducting terminal.

15. The electronic device as claimed in claim 8, further comprising at least one flexible transmission line that corresponds in number to said connection port module, each of said at least one flexible transmission line electrically connecting said circuit board of a corresponding one of said at least one connection port module to said control circuit, said rotating box of each of said at least one connection port module being further formed with a through hole for extension of the corresponding one of said at least one flexible transmission line therethrough.

16. The electronic device as claimed in claim 8, comprising two of said connection port modules, said housing including two of said side walls opposite to each other, said connection port modules being respectively and pivotably coupled to said side walls of said housing.

* * * * *